United States Patent [19]

Smith et al.

[11] Patent Number: 4,504,747

[45] Date of Patent: Mar. 12, 1985

[54] INPUT BUFFER CIRCUIT FOR RECEIVING MULTIPLE LEVEL INPUT VOLTAGES

[75] Inventors: Michael D. Smith, Austin, Tex.; Andrew S. Olesin, Maynard, Mass.; Roger A. Whatley, Austin, Tex.

[73] Assignee: Motorola, Inc., Schaumburg, Ill.

[21] Appl. No.: 550,671

[22] Filed: Nov. 10, 1983

[51] Int. Cl.³ .................. H03K 19/092; H03K 19/094
[52] U.S. Cl. ..................... 307/475; 307/246; 307/264; 307/279; 307/360; 307/446
[58] Field of Search .............. 307/443, 446, 448, 451, 307/475, 354, 360, 243, 246, 247 R, 264, 279, 601, 605

[56] References Cited

U.S. PATENT DOCUMENTS

| | | | |
|---|---|---|---|
| 4,080,539 | 3/1978 | Stewart | 307/264 |
| 4,321,491 | 3/1982 | Atherton et al. | 307/446 X |
| 4,438,352 | 3/1984 | Mardkha | 307/443 X |
| 4,446,390 | 5/1984 | Alaspa | 307/243 X |
| 4,450,371 | 5/1984 | Bismarck | 307/475 |
| 4,463,273 | 7/1984 | Dingwall | 307/443 X |
| 4,464,587 | 8/1984 | Suzuki et al. | 307/451 X |
| 4,472,647 | 9/1984 | Allgood et al. | 307/475 |

FOREIGN PATENT DOCUMENTS 2077541  12/1981  United Kingdom .............. 307/475

OTHER PUBLICATIONS

Lee et al., "Voltage Level Transfer Driver Circuits", IBM TDB, vol. 25, No. 11B, Apr., 1983, pp. 6068–6069.
Rock, "Positive Ground Bounce Protection Circuit", IBM TDB, vol. 22, No. 4, Sep., 1979, pp. 1409–1410.
Elliott et al., "Regenerative TTL Receiver Using Enhancement and Depletion FET Devices", IBM TDB, vol. 18, No. 10, Mar., 1976, pp. 3259–3260.

Primary Examiner—Stanley D. Miller
Assistant Examiner—D. R. Hudspeth
Attorney, Agent, or Firm—Anthony J. Sarli, Jr.; Jeffrey Van Myers; Robert L. King

[57] ABSTRACT

An input buffer circuit having a single input for receiving input voltages characterized by having varying voltage swings is provided. First and second inverter circuits having differing switchpoint voltages are coupled to a level shifting position. The level shifting portion varies the level of swing of the input voltage and buffers the input voltage. In one form, voltage coupling circuitry is interposed between the level shifting portion and a latching portion which provides the input voltage as an output signal at a predetermined voltage level. In another form, voltage coupling circuitry controlled by control circuitry couples the output of the level shifting portion to an output in response to the input voltage.

11 Claims, 4 Drawing Figures

4,504,747

INPUT-BUFFER CIRCUIT FOR RECEIVING MULTIPLE LEVEL INPUT VOLTAGES

TECHNICAL FIELD

This invention relates generally to buffer circuits, and more particularly, to buffer circuits which are operable with variable ranges of input voltages.

BACKGROUND ART

For many applications buffer circuits must be operable for various ranges of input voltages. For example, applications commonly exist when a buffer circuit must accept both TTL voltage levels and MOS voltage levels. Previously, multiple voltage level buffer circuits requiring circuitry dedicated for each voltage level have been used. Such circuits require multiple inputs and utilize circuitry which detects an input voltage level. Others have used a trinary input buffer which is also known as a tri-state device. Trinary input buffers however typically consume power when in a static state. Other buffer circuits which accept multiple level input voltages require a separate pin in an integrated circuit package which is used to indicate what level to detect.

SUMMARY OF THE INVENTION

An object of the present invention is to provide an improved input buffer circuit for receiving multiple level input voltages.

Another object of the present invention is to provide an improved input buffer circuit having a single input.

In carrying out the above and other objects of the present invention, there is provided, in one form, an input buffer circuit having a single input for receiving input voltages having varying voltage swings. First and second inverter circuits having differing trip points are coupled to level shifting means. The level shifting means vary the level of swing of the input voltage and buffer the input voltage. In one form, voltage coupling circuitry is interposed between the level shifting means and latching means. The latching means provide the input voltage as an output signal at a predetermined voltage level. In a preferred form, the voltage coupling circuitry comprises capacitors which store the level shifted input voltage. In another form, digital logic is used to selectively couple the input voltage to an output terminal from level shifting means.

The above, and other objects, features and advantages of the present invention will be best understood from the following detailed description taken in conjunction with the following drawings.

DETAILED DESCRIPTION OF THE INVENTION

Figure 1:
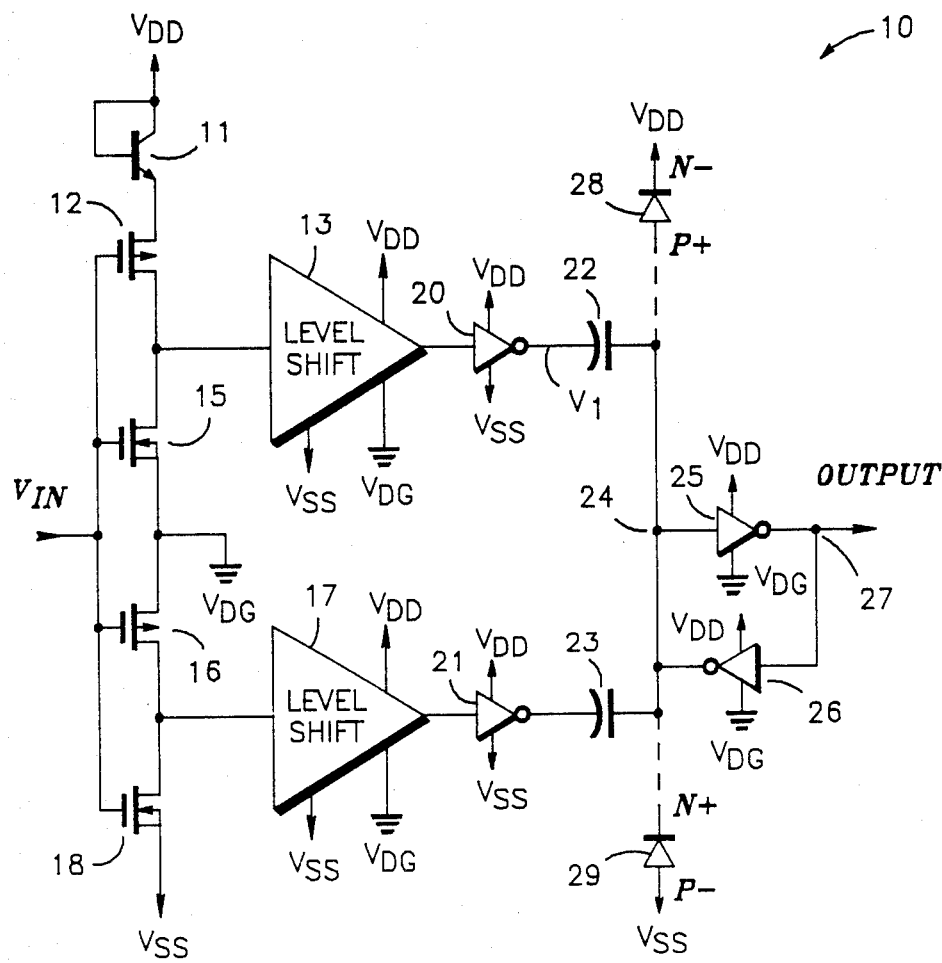
FIG. 1 illustrates in partial schematic form a first embodiment of the present invention.

Shown in FIG. 1 is an input buffer circuit 10 which is capable of receiving an input voltage $V_{IN}$ having a variable range of voltages. In a preferred form, input voltage $V_{IN}$ may vary between a minimum and a maximum voltage level within each range. A bipolar transistor 11 has a collector electrode connected to both a base electrode thereof and to a positive supply voltage $V_{DD}$. An emitter electrode of transistor 11 is connected to a source electrode of a P channel transistor 12. A drain electrode of transistor 12 is connected to both an input of a level shift circuit 13 and a drain electrode of an N channel transistor 15. Both a gate electrode of transistor 15 and a gate electrode of transistor 12 are connected to input voltage $V_{IN}$, and a source electrode of transistor 15 is connected to the substrate thereof. The source electrode of transistor 15 is connected to a digital ground supply voltage $V_{DG}$ and to a source electrode of a P channel transistor 16. A gate electrode of transistor 16 is connected to input voltage $V_{IN}$, and a drain electrode of transistor 16 is connected to both an input of a level shift circuit 17 and a drain electrode of transistor 18. A gate electrode of transistor 18 is connected to input voltage $V_{IN}$ and a source electrode of transistor 18 is connected to the substrate thereof. The source electrode of transistor 18 is also connected to negative supply voltage $V_{SS}$. While a specific bipolar device and P channel and N channel MOS devices are shown, it should be clear that buffer circuit 10 may be implemented by completely reversing the processing techniques (e.g. P channel to N channel) or by using other types of transistors. Level shift circuits 13 and 17 are conventional level shifting circuits which utilize supply voltages $V_{DD}$ and $V_{SS}$ and digital ground $V_{DG}$ as illustrated in FIG. 1. An output of level shift circuit 13 is connected to an input of an inverter circuit 20 which utilizes supply voltages $V_{DD}$ and $V_{SS}$. An output of inverter circuit 20 is connected to a first electrode of a capacitor 22. An output of level shift circuit 17 is connected to an input of an inverter circuit 21 which also utilizes supply voltages $V_{DD}$ and $V_{SS}$. An output of output inverter 21 is connected to a first electrode of capacitor 23. A second electrode of capacitor 22 is connected to a second electrode of capacitor 23 at a node 24. An input of an inverter circuit 25 is connected to node 24, and an output of inverter circuit 25, which provides an output voltage, is connected to an input of an output inverter circuit 26 via an output node 27. An output of inverter 26 is connected to node 24. Output inverter circuits 25 and 26 utilize supply voltages $V_{DD}$ and $V_{DG}$ as illustrated. An intrinsic parasitic diffusion diode 28 exists between node 24 and positive supply voltage $V_{DD}$. An intrinsic parasitic diffusion diode 29 exists between node 24 and negative supply voltage $V_{SS}$.

In operation, transistors 11, 12 and 15 function as a first inverter circuit and transistors 16 and 18 function as a second inverter circuit. The digital ground voltage is arbitrarily chosen as a mid-supply voltage. Buffer circuit 10 can detect input signals having three different voltage levels. The first voltage level range is from $V_{DG}$ to $V_{DD}$, and the second voltage level range is from $V_{DG}$ to $V_{SS}$. The third voltage level range is from $V_{DD}$ to $V_{SS}$. The first inverter circuit of transistors 11, 12 and 15 detects input voltage level swings between $V_{DG}$ and $V_{DD}$. The second inverter circuit of transistors 16 and 18 detects input voltage level swings between $V_{DG}$ and $V_{SS}$. Both inverter circuits are utilized to detect input voltage level swings between $V_{SS}$ and $V_{DD}$. The physical dimensions of the gate electrode of transistor 15 is made large in comparison to the dimensions of the gate electrode of transistor 12 so that a TTL switchpoint of approximately 1.4 volts is established for the first inverter comprising transistors 11, 12 and 15 assuming $V_{DD}$ is five volts and $V_{DG}$ is zero volts. In the second inverter circuit of transistors 16 and 18, the physical dimensions of the gate electrode of transistor 16 are preferably made larger than the gate electrode dimensions of transistor 18 to compensate for conventional back gate bias effects and to establish a typical MOS switchpoint halfway between $V_{DG}$ and $V_{SS}$. Level shift circuit 13 translates the voltage swing from $V_{DG}$ to $V_{DD}$ at the input thereof to $V_{SS}$ to $V_{DD}$. Similarly, level shift circuit 17 translates the voltage swing from $V_{DG}$ to $V_{SS}$ at the input thereof to $V_{SS}$ to $V_{DD}$. The purpose of having a full voltage level swing at the outputs of inverters 20 and 21 is to insure that a sufficient voltage swing exists to switch output inverter 25.

Figure 2A:
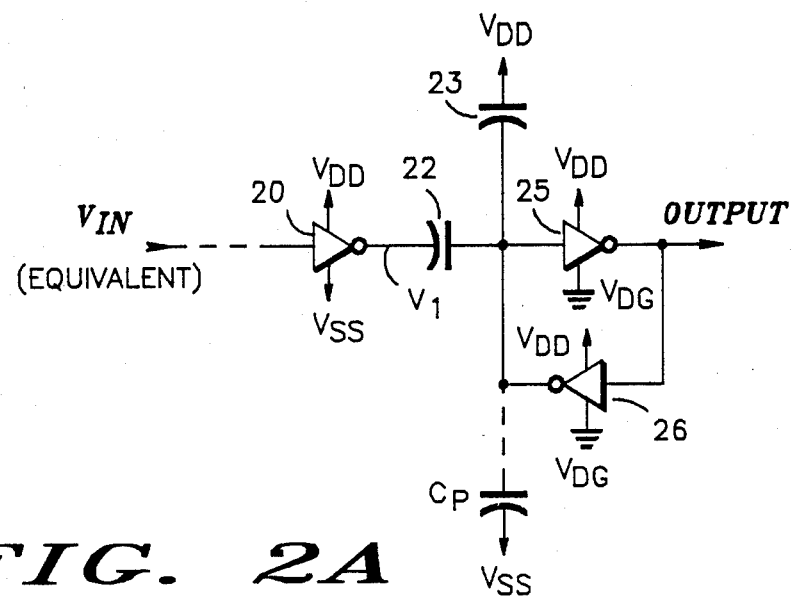
FIG. 2(a) illustrates in partial schematic form a partial equivalent circuit of the circuit of FIG. 1 for a predetermined mode of operation.

Initially, assume that the input voltage swing is from $V_{DG}$ to $V_{DD}$. The input of level shift circuit 17 will remain constant at $V_{SS}$ because the input voltage is always sufficient to make transistor 18 conductive and transistor 16 nonconductive regardless of the input voltage swing in this range. Therefore, the input of inverter 21 will remain at a logic low value and the first electrode of capacitor 23 will be clamped at approximately $V_{DD}$. However, the input of level shift circuit 13 will receive the inverted input voltage $V_{IN}$. Assuming for the purpose of illustration only that $V_{DD}$ is positive five volts, $V_{DG}$ is zero volts and $V_{SS}$ is negative five volts, if the input of level shift circuit 13 is five volts, the output of level shift circuit 13 is also five volts. Also, if the input of level shift circuit 13 is zero volts, the output of level shift circuit 13 transitions to negative five volts. A partial equivalent circuit of buffer circuit 10 is shown in FIG. 2(a) when the input voltage varies in the mid to upper supply voltage range, i.e., where $V_{IN}$ varies from zero to five volts. It can thus be readily shown that the A.C. voltage level at node 24, $V_{24}$, ignoring the effects of output inverter circuit 26 is approximately:

$$V_{24} = V_1[C_{22}/(C_{22} + C_{23} + C_p)]$$

where
$V_1$ = the voltage at the output of inverter 20
$C_{22}$ = the capacitive value of capacitor 22
$C_{23}$ = the capacitive value of capacitor 23; and
$C_p$ = the capacitive value of the parasitic capacitance associated with intrinsic diodes 28 and 29.

Before the voltage at node 24 varies, the voltage will be held by inverter 26 at either $V_{DD}$ or $V_{DG}$. Voltage $V_{24}$ varies in accordance with the given equation to establish a switchpoint voltage for output inverter 25. Therefore, if capacitors 22 and 23 are substantially equal in value, the voltage swing at node 24 will be slightly less than five volts depending upon the amount of parasitic capacitance. Assume for the purpose of illustration only that input buffer circuit 10 has been operable for several transitions of $V_{IN}$ between $V_{DG}$ and $V_{DD}$. Output inverter 26 functions as a feedback device. When $V_{IN}$ is $V_{DG}$ volts, the output voltage is at $V_{DD}$ volts and inverter 26 tries to keep node 24 at $V_{DG}$ volts. Since the current flowing through capacitor 22 must be large enough to overcome the effects of output inverter 26, output inverter 26 is made weak enough to be easily overridden. Assume now that $V_{IN}$ increases toward $V_{DD}$ volts so that the voltage potential at node 24 increases toward $V_{DD}$. When the voltage at node 24 is made to equal approximately the trippoint voltage of output inverter 25, output inverter 25 trips so that the output changes to a low logic value of $V_{DG}$ volts. Once output inverter 25 changes logic state or trips, output inverter 26 helps drive node 24 to $V_{DD}$ volts. When the input voltage $V_{IN}$ swings back to $V_{DG}$, node 24 transitions back to $V_{DG}$ volts, and the output becomes $V_{DD}$ volts again. Level shift circuit 13 and inverter 20 function jointly to guarantee that the transition voltage at the input of output inverter 25 will be sufficient to trip or switch inverter 25.

By the nature of the capacitive coupling of the input voltage of output inverter 25 by capacitors 22 and 23, output inverter 25 will trip logic states when $V_{IN}$ switches levels within its voltage swing range. Thus input buffer circuit 10 is edge triggered. Therefore, if $V_{IN}$ is initially equal to $V_{DG}$, an ambiguity in the output may exist until a voltage transition is coupled by capacitor 22 or capacitor 23 to node 24. However, once an initial edge or transition occurs, the output will not experience another indeterminate state.

Figure 2B:
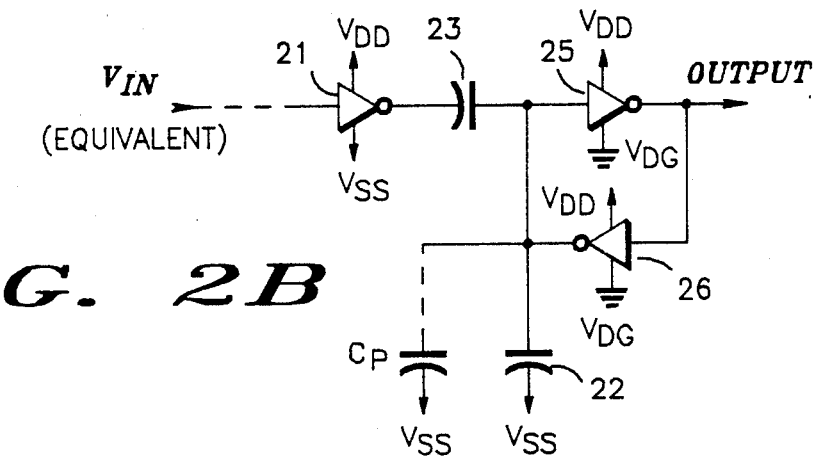
FIG. 2(b) illustrates in partial schematic form a partial equivalent circuit of the circuit of FIG. 1 for a second predetermined mode of operation.

In a second mode of operation, assume that the input voltage swing is from $V_{DG}$ to $V_{SS}$ volts. The input of level shift circuit 13 will remain constant at $V_{DD}$ because the input voltage is always sufficient to make transistor 12 conductive and transistor 15 nonconductive regardless of the input voltage level within this range. Therefore, the input of inverter 20 will remain at a logic high value and the first electrode of capacitor 22 will remain clamped at $V_{SS}$. However, the output of the inverter comprising transistors 16 and 18 will logically invert the input voltage as the input voltage varies in the range between $V_{DG}$ and $V_{SS}$. Assuming again that $V_{DD}$ is positive five volts, that $V_{DG}$ is zero volts and that $V_{SS}$ is negative five volts, if $V_{IN}$ is initially at $V_{DG}$ volts, the input of level shift circuit 17 is negative five volts and the output of level shift circuit 17 is also negative five volts. Similarly, if $V_{IN}$ is at $V_{SS}$ volts, the input of level shift circuit 17 is at $V_{DG}$ volts and the output of level shift circuit 17 is at positive five volts. A partial equivalent circuit of buffer circuit 10 is shown in FIG. 2(b) when the input voltage, $V_{IN}$, varies in the mid to lower supply voltage range ($V_{DG}$ to $V_{SS}$) causing the equivalent input voltage to vary from positive five to negative five volts. It can readily be shown that the A.C. voltage now at node 24 and again ignoring the effects of output inverter 26 is substantially:

$$V_{24} = V_2[C_{23}/(C_{22} + C_{23} + C_p)]$$

where $V_2$ = the voltage at the output of inverter 21. Again, if capacitors 22 and 23 are substantially equal in value, the voltage swing at node 24 will be slightly less than five volts depending upon the amount of parasitic capacitance. When the equivalent input voltage swings to $V_{SS}$ volts, the output voltage is at a low logic value. When the equivalent input voltage transitions up to $V_{DD}$ volts, the output voltage is at a high logic value level. Level shift circuit 17 and inverter 21 function jointly to guarantee that the transition voltage at the input of output inverter 25 will be sufficient to trip or switch inverter 25.

In a third mode of operation, assume that the input voltage swing is from $V_{SS}$ to $V_{DD}$ volts. The inputs of level shift circuits 13 and 17 will swing in the same direction for a transistion in the input voltage causing corresponding inversions at the outputs of inverters 20 and 21. As a result of the level shifting, voltages $V_1$ and $V_2$ will each change ten volts A.C.. As a result of the capacitive ratios and capacitors 22 and 23 having substantially equal values, both voltage $V_1$ and $V_2$ will be reduced to approximately five volts and summed at node 24. Therefore, approximately ten volts of A.C. voltage swing is present at node 24. Parasitic diodes 28 and 29 which result from the drain to substrate interface of the two small transistors used to form inverter 26 will clamp node 24 at either $V_{DG}-0.6$ volts or $V_{DD}+0.6$ volts. The clamping action provided by intrinsic parasitic diffusion diodes 28 and 29 is desirable because the clamping allows node 24 to recover faster and accept a higher frequency input signal.

By now it should be apparent that an input buffer which is voltage edge sensitive and which has a single input which may accept three ranges of input voltages has been provided. The edge detection is accomplished by lengthening the edges of the input signal via level shifting circuitry and by utilizing capacitors 22 and 23 to trigger a latch implemented in the form of inverters 25 and 26. Capacitors 22 and 23 are substantially insensitive to voltage spikes and edges created by noise and transients due to the presence of level shift circuits 13 and 17 and inverters 20 and 21 which function as buffers. No additional controls indicating which range of input voltages is being utilized is required. It should also be noted that an input buffer which may accept more levels of an input voltage may be provided by utilizing additional level detecting circuitry. Such circuitry for each additional level would include additional inverters such as transistors 16 and 18 coupled in series with an additional level shifting circuit and an additional capacitor. Such additional circuitry would be coupled to the input of output inverter 25.

Figure 3:
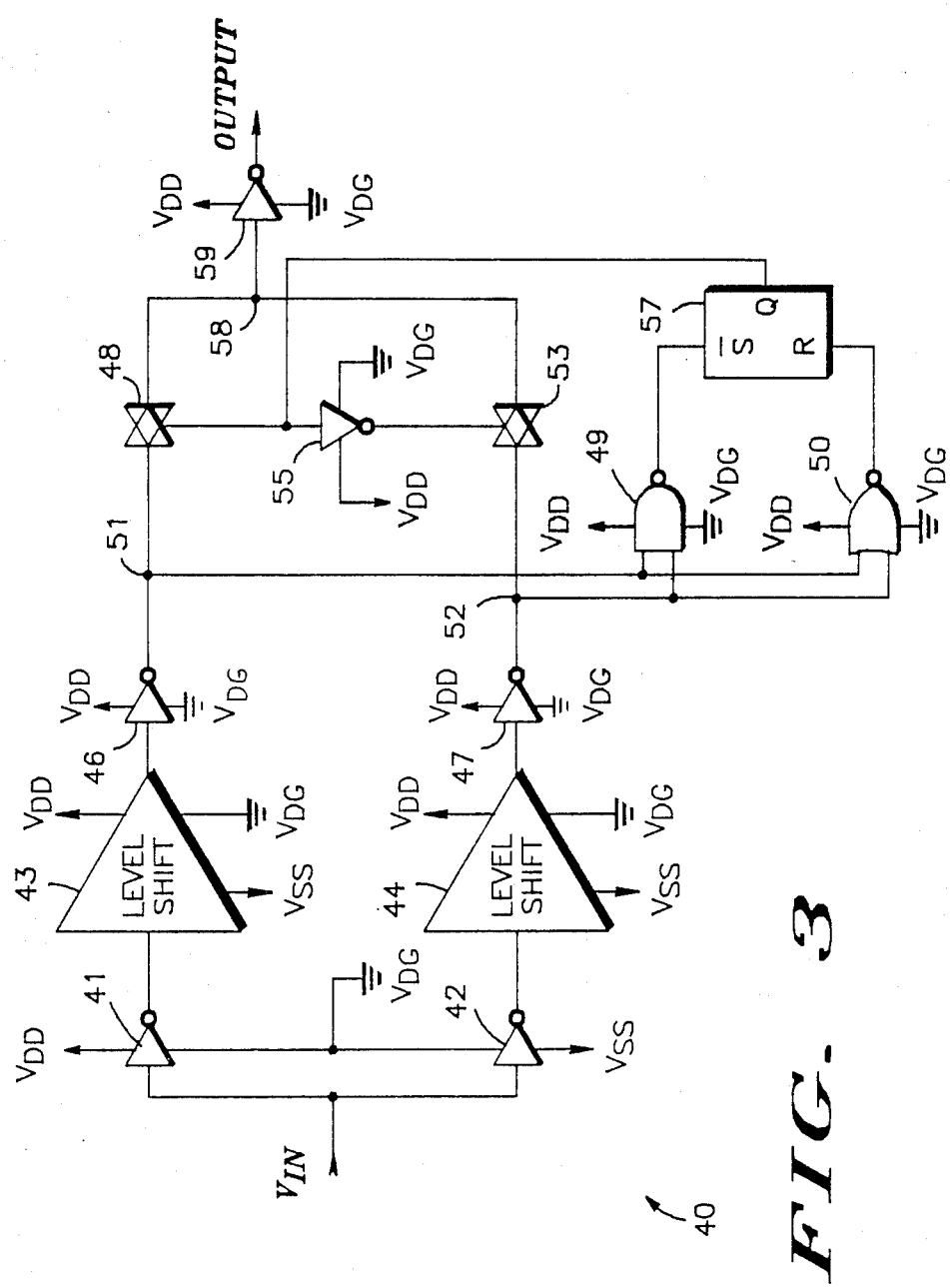
FIG. 3 illustrates in partial schematic form another embodiment of the present invention.

Shown in FIG. 3 is another embodiment of the present invention which functions as a multiple level input buffer circuit 40 which detects the upper or lower rail voltage. Due to the absence of capacitors, this embodiment is not edge sensitive but rather rail sensitive. An inverter 41 has an input connected to an input voltage $V_{IN}$ and to an input of an inverter 42. An output of inverter 41 is connected to an input of a level shift circuit 43, and an output of inverter 42 is connected to an input of a level shift circuit 44. Inverter 41 operates in a voltage range between a positive supply voltage $V_{DD}$ and a digital ground voltage, $V_{DG}$, as illustrated. Inverter 42 operates in a voltage range between digital ground, $V_{DG}$, and a negative supply voltage $V_{SS}$. Level shift circuits 43 and 44 are each connected to $V_{SS}$, $V_{DD}$ and $V_{DG}$ and shift an input voltage between $V_{DG}$ and $V_{DD}$. An output of level shift circuit 43 is connected to an input of an inverter 46 which operates between voltages $V_{DD}$ and $V_{DG}$. An output of level shift circuit 44 is connected to an input of an inverter 47 which also operates between voltages $V_{DD}$ and $V_{DG}$. An output of inverter 46 is connected to a first terminal of a switch 48, to a first input of a dual input NAND gate 49 and to a first input of a dual input NOR gate 50 at a node 51. An output of inverter 47 is connected to a first terminal of a switch 53, to a second input of NAND gate 49, and to a second input of NOR gate 50 at a node 52. In a preferred form, switches 48 and 53 are implemented by CMOS transmission gates which are clocked in a conventional manner. An N channel control terminal of switch 48 is connected to an input of an inverter circuit 55, and an output of inverter circuit 55 is connected to an N channel control terminal of switch 53. Inverter circuit 55 operates between voltages $V_{DG}$ and $V_{DD}$ as illustrated. An output of NAND gate 49 is connected to a complementary set terminal, $\overline{S}$, of a conventional SR flip flop circuit 57. An output of NOR gate 50 is connected to a reset terminal, R, of SR flip flop circuit 57. A Q output of flip flop circuit 57 is connected to the input of inverter circuit 55. A second terminal of both switches 48 and 53 are connected together at a node 58 to an input of an inverter circuit 59. An output of inverter circuit 59 provides an output signal. Inverter circuit 59 operates between voltages $V_{DG}$ and $V_{DD}$.

In a first mode of operation, assume that the input voltage varies from $V_{DG}$ to $V_{DD}$. The input of level shift circuit 44 is always a low logic level. Therefore, the output of inverter circuit 47 is fixed as a logic high level. When $V_{IN}$ transitions from $V_{DG}$ to $V_{DD}$, level shift circuit 43 maintains a low logic level of $V_{DG}$. Although level shift circuit 43 does not function to level shift in this situation, level shift circuit 43 equalizes the voltage delay of the input voltage $V_{IN}$ to node 24 with the voltage delay associated with level shift circuit 17. Inverter 46 provides a high logic level of $V_{DD}$ volts. The high logic levels present at both nodes 51 and 52 function via flip flop circuit 57 and associated logic to make switch 48 conductive and switch 53 nonconductive. Therefore, the output of inverter circuit 59 is a logic low level. As the input voltage changes, the output voltage will vary in an inverse manner. In a preferred form of SR flip flop 57, the reset function is dominant. Therefore, when the voltage potential at node 51 returns to $V_{DG}$, although the complementary set terminal changes logic level, the reset terminal of SR flip flop 57 remains at a logic low level. As a result, the Q output of SR flip flop circuit 57 remains at a logic high level maintaining switch 48 conductive. The only possible indeterminate state the output can have is if initially $V_{IN}$ is at $V_{DG}$. However, once $V_{IN}$ transitions to a rail voltage, no indeterminate states will occur at the output.

In a second mode of operation, assume that the input voltage varies from $V_{DG}$ to $V_{SS}$. The input of level shift circuit 43 is always at a high logic level. Therefore, the output of inverter circuit 46 remains as a logic low level. When the input voltage transitions to $V_{SS}$, a logic low occurs at the output of inverter 47. Therefore, switch 53 is made conductive and switch 48 nonconductive by flip flop circuit 57 and associated logic. Again, an indeterminate state may initially occur only if $V_{IN}$ is at $V_{DG}$.

In a third mode of operation, assume that the input voltage varies from $V_{DD}$ to $V_{SS}$. When the input voltage is at $V_{DD}$, switch 48 is conductive and switch 53 nonconductive, and the output is at a logic low level. When the input voltage is at $V_{SS}$, switch 53 is conductive and switch 48 nonconductive, and the output is at a logic high level. Thus, buffer circuit 40 detects which rail voltage is reached and provides a corresponding output voltage. During at least one of the multiple levels of input voltages, level shift circuit 43 is not needed for voltage level translation due to the fact that the level of the input voltage is already adequately translated for inverter circuit 46. However, in this mode of operation level shift circuit 43 is used in conjunction with level shift circuit 44 to equalize the delay time of the input signal through the two paths leading from the input terminal to nodes 51 and 52, respectively. A buffer circuit which can receive via a single input terminal an input voltage having a plurality of voltage level swings has again been provided. Although an input voltage transition to one of the rail voltages is initially necessary for the output voltage to be in a determined state, the initial indeterminate state may be elminated by using a conventional power on reset circuit which provides an initial rail voltage at the Q output of SR flip flop circuit 57 immediately upon powering up of the circuit.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. An input buffer circuit for receiving multiple level input voltages comprising:
    a first inverter having an input for receiving an input voltage which has an amplitude which varies by one of a plurality of levels, and an output;
    a second inverter coupled to the first inverter and having an input for receiving the input voltage, and an output;
    voltage level shifting means having a first input coupled to the output of the first inverter, a second input connected to the output of the second inverter, and first and second outputs for buffering and shifting the input voltage a predetermined amount;
    a first capacitor having a first electrode coupled to the first output of the voltage level shifting means, and a second electrode;
    a second capacitor having a first electrode coupled to the second output of the voltage level shifting means, and a second electrode; and
    latching means coupled to the second electrodes of the first and second capacitors for latching the voltage level due to the charge on the first and second capacitors and providing an output.

2. The input buffer circuit of claim 1 wherein said voltage level shifting means further comprise:
    first voltage level shifting means having an input connected to the output of the first inverter, and an output for shifting the level of the input voltage a first predetermined amount; and
    second voltage level shifting means having an input connected to the output of the second inverter, and an output for shifting the level of the input voltage a second predetermined amount.

3. The input buffer circuit of claim 1 wherein said first inverter comprises:
    a bipolar transistor having a first current electrode connected to both a control electrode thereof and a terminal for receiving a first supply voltage, and a second current electrode;
    a second transistor of a first conductivity type having a first current electrode connected to the second current electrode of the bipolar transistor, a control electrode connected to the input voltage, and a second current electrode connected to the input of the first voltage level shifting means; and
    a third transistor of a second conductivity type having a first current electrode connected to the the second current electrode of the second transistor, a control electrode connected to the input voltage, and a second current electrode connected to both the second inverter and a terminal for receiving a second supply voltage.

4. The input buffer circuit of claim 3 wherein said second inverter comprises:
    a fourth transistor of the first conductivity type having a first current electrode connected to the terminal for receiving the second supply voltage, a control electrode connected to the input voltage, and a second current electrode conntected to the input of the second voltage level shifting means; and
    a fifth transistor of the second conductivity type having a first current electode connected to the second current electrode of the fourth transistor, a control electrode connected to the control electrode, and a second current electrode connected to a terminal for receiving a third supply voltage.

5. An input buffer circuit for receiving multiple level input voltages comprising:
    a first inverter having an input for receiving an input voltage, an output, and a first predetermined switch point;
    a second inverter connected to the first inverter and having an input for receiving the input voltage, and output, and a second predetermined switch point;
    first voltage level shifting means having an input coupled to the output of the first inverter, and an output for shifting the level of the input voltage a predetermined amount;
    a second voltage level shifting means having an input coupled to the output of the second inverter, and an output for shifting the level of the input voltage a predetermined amount; and
    a third inverter having an input coupled to the output of the first voltage level shifting means, and an output;
    a fourth inverter having an input coupled to the output of the second voltage level shifting means, and an output;
    a first capacitor having a first electrode coupled to the third inverter, and a second electrode;
    a second capacitor having a first electrode coupled to the fourth inverter, and a second electrode;
    a fifth inverter having an input coupled to the second electrodes of the first and second capacitors, and an output for providing a buffered output signal of predetermined voltage level in response to the input voltage; and
    a sixth inverter having an input coupled to the output of the fifth inverter, and an output coupled to the input of the first inverter, said sixth inverter thereby raising the voltage level at which the fifth inverter switches.

6. The input buffer circuit of claim 5 wherein said first inverter comprises:
    a bipolar transistor having a first current electrode coupled to both a control electrode thereof and a terminal for receiving a first supply voltage, and a second current electrode;
    a second transistor of a first conductivity type having a first current electrode coupled to the second current electrode of the bipolar transistor, a control electrode coupled to the input voltage, and a second current electrode coupled to the input of the first voltage level shifting means; and
    a third transistor of a second conductivity type having a first current electrode coupled to the second current electrode of the second transistor, a control electrode coupled to the input voltage, and a second current electrode coupled to both the second inverter and a terminal for receiving a second supply voltage.

7. The input buffer circuit of claim 6 wherein said second inverter comprises:
   a fourth transistor of the first conductivity type having a first current electrode coupled to the terminal for receiving the second supply voltage, a control electrode coupled to the input voltage, and a second current electrode coupled to the input of the second voltage level shifting means; and
   a fifth transistor of the second conductivity type having a first current electrode coupled to the second current electrode of the fourth transistor, a control electrode coupled to the control electrode, and a second current electrode coupled to a terminal for receiving a third supply voltage.

8. An input buffer circuit for receiving multiple level input voltages comprising:
   a first inverter having an input for receiving an input voltage, an output, and a first predetermined switch point;
   a second inverter coupled to the first inverter and having an input for receiving the input voltage, an output, and a second predetermined switch point;
   voltage level shifting means having a first input coupled to the output of the first inverter, a second input coupled to the output of the second inverter, a first output for shifting the level of the input voltage a first predetermined amount, and a second output for shifting the level of the input voltage a second predetermined amount;
   coupling means having first and second inputs coupled to the first and second outputs of the voltage level shifting means, respectively, first and second outputs coupled to an output terminal for providing an output signal having a predetermined voltage level, and first and second control terminals; and
   control means coupled to the coupling means, for actuating the coupling means in response to the input voltage.

9. The input buffer circuit of claim 8 wherein said voltage level shifting means further comprise:
   first voltage level shifting means having an input coupled to the output of the first inverter, and an output for shifting the level of the input voltage a first predetermined amount; and
   second voltage level shifting means having an input coupled to the output of the second inverter, and an output for shifting the level of the input voltage a second predetermined amount.

10. The input buffer circuit of claim 9 wherein said first inverter comprises:
    a bipolar transistor having a first current electrode coupled to both a control electrode thereof and to a terminal for receiving a first supply voltage, and a second current electrode;
    a second transistor of a first conductivity type having a first current electrode coupled to the second current electrode of the bipolar transistor, a control electrode coupled to the input voltage, and a second current electrode coupled to the input of the first voltage level shifting means; and
    a third transistor of a second conductivity type having a first current electrode coupled to the the second current electrode of the second transistor, a control electrode coupled to the input voltage, and a second current electrode coupled to both the second inverter and a terminal for receiving a second supply voltage.

11. The input buffer circuit of claim 9 wherein said second inverter comprises:
    a fourth transistor of the first conductivity type having a first current electrode coupled to the terminal for receiving the second supply having a first current electrode coupled to the second current electrode of the bipolar transistor, a control electrode coupled to the input voltage, and a second current electrode coupled to the input of the first voltage level shifting means; and
    a fifth transistor of the second conductivity type having a first current electrode coupled to the second current electrode of the fourth transistor, a control electrode coupled to the control electrode, and a second current electrode coupled to a terminal for receiving a third supply voltage.

* * * * *